United States Patent
Shao et al.

(10) Patent No.: US 9,613,583 B2
(45) Date of Patent: Apr. 4, 2017

(54) SHIFT REGISTER UNIT AND DRIVING METHOD THEREFOR, SHIFT REGISTER, DISPLAY DEVICE

(71) Applicants: BOE TECHNOLOGY GROUP CO., LTD., Beijing (CN); HEFEI BOE OPTOELECTRONICS TECHNOLOGY CO., LTD., Hefei, Anhui (CN)

(72) Inventors: Xianjie Shao, Beijing (CN); Hongmin Li, Beijing (CN); Xiaohe Li, Beijing (CN); Yong Liu, Beijing (CN); Qinghua Jiang, Beijing (CN); Xiaojie Zhang, Beijing (CN); Feng Qin, Beijing (CN)

(73) Assignees: BOE TECHNOLOGY GROUP CO., LTD., Beijing (CN); HEFEI BOE OPTOELECTRONICS TECHNOLOGY CO., LTD., Hefei, Anhui (CN)

( * ) Notice: Subject to any disclaimer, the term of this patent is extended or adjusted under 35 U.S.C. 154(b) by 58 days.

(21) Appl. No.: 14/424,247

(22) PCT Filed: May 23, 2014

(86) PCT No.: PCT/CN2014/078274
§ 371 (c)(1),
(2) Date: Feb. 26, 2015

(87) PCT Pub. No.: WO2015/096372
PCT Pub. Date: Jul. 2, 2015

(65) Prior Publication Data
US 2016/0049128 A1 Feb. 18, 2016

(30) Foreign Application Priority Data
Dec. 27, 2013 (CN) .......................... 2013 1 0738632

(51) Int. Cl.
G06F 3/038 (2013.01)
G09G 3/36 (2006.01)
G11C 19/28 (2006.01)

(52) U.S. Cl.
CPC .......... G09G 3/3677 (2013.01); G11C 19/28 (2013.01); *G09G 2300/0408* (2013.01);
(Continued)

(58) Field of Classification Search
CPC ........ G09G 3/3677; G09G 2300/0408; G09G 2300/0871; G09G 2310/0291;
(Continued)

(56) References Cited

U.S. PATENT DOCUMENTS

2003/0184512 A1 10/2003 Hayashi et al.
2010/0007635 A1 1/2010 Kwon et al.
(Continued)

FOREIGN PATENT DOCUMENTS

CN 1447299 A 10/2003
CN 101533623 A 9/2009
(Continued)

OTHER PUBLICATIONS

Second Chinese Office Action Appln. No. 201310738632.3; Dated Jan. 13, 2016.
(Continued)

*Primary Examiner* — Mark Regn
(74) *Attorney, Agent, or Firm* — Ladas & Parry LLP

(57) ABSTRACT

There is provided a shift register unit and driving method for the shift register unit, a shift register and a display device. The shift register unit comprises a first capacitor (C1), an input buffering module (31), a pulling-up module (32), a reset control module (33), a pulling-down module (34) and a pulling-down enhancement module (35); the pulling-down module (34) is configured to reduce the level at the signal
(Continued)

output terminal (OUTPUT) and discharge the first capacitor (C1) during a first noise-removal phase; the pulling-down enhancement module (35) is configured to control, in cooperation with the pulling-down module (34), to continuously reduce the level at the signal output terminal (OUTPUT) and continuously discharge the first capacitor (C1) during a second noise-removal phase. Noise in the output signals of the shift register can be reduced and reliability of the shift register can be improved.

14 Claims, 4 Drawing Sheets

(52) U.S. Cl.
CPC ........... *G09G 2300/0871* (2013.01); *G09G 2310/0291* (2013.01); *G09G 2310/08* (2013.01); *G09G 2320/0219* (2013.01); *G09G 2320/043* (2013.01)

(58) Field of Classification Search
CPC ....... G09G 2310/08; G09G 2320/0219; G09G 2320/043; G11C 19/28
USPC .......................................... 345/204
See application file for complete search history.

(56) References Cited

U.S. PATENT DOCUMENTS

| | | |
|---|---|---|
| 2010/0231497 A1 | 9/2010 | Liao et al. |
| 2010/0316182 A1 | 12/2010 | Lai |
| 2012/0256817 A1 | 10/2012 | Chen et al. |
| 2014/0079173 A1* | 3/2014 | Yan ........................ G11C 19/28 377/64 |

FOREIGN PATENT DOCUMENTS

| | | |
|---|---|---|
| CN | 101625838 A | 1/2010 |
| CN | 102651186 A | 8/2012 |
| CN | 102708926 A | 10/2012 |
| CN | 103700356 A | 4/2014 |

OTHER PUBLICATIONS

International Search Report mailed Oct. 13, 2014; PCT/CN2014/078274.

Written Opinion of the International Searching Authority mailed Oct. 13, 2014; PCT/CN2014/078274.

First Chinese Office Action dated May 6, 2015; Appln. No. 201310738632.3.

* cited by examiner

SHIFT REGISTER UNIT AND DRIVING METHOD THEREFOR, SHIFT REGISTER, DISPLAY DEVICE

TECHNICAL FIELD OF THE DISCLOSURE

The present disclosure relates to a shift register unit and driving method for the shift register unit, a shift register and a display device.

BACKGROUND

A liquid crystal display panel displays an image by adopting a matrix of M*N pixels which are scanned row by row. Drivers for Thin Film Transistor-Liquid Crystal Display (TFT-LCD) mainly comprise a gate driver and a data driver, wherein the gate driver supplies gate lines of the liquid crystal display panel with signals converted by a shift register from input clock signals.

A shift register is commonly adopted in a gate driver of a liquid crystal display panel, and each of gate lines is connected to a stage of circuit units in the shift register. Gate input signals are outputted from the gate driving circuit, so as to scan pixels row by row. The Gate Driving Circuit can be set in a display panel by adopting a packaging manner of Chip on Array (COF) or Chip on Glass (COG) technology. In a display panel, it is also possible to form integrated circuit units on the display panel by TFTs. For a liquid crystal display panel, Gate on Array (GOA) technology can reduce the cost of product, and can improve productivity by removing one process.

A typical structure of an existing shift register unit is as shown in FIG. 1. FIG. 2 is an operational timing sequence diagram of the shift register unit as shown in FIG. 1, and the operation principle of the shift register unit is as follows.

During a first phase, a signal input terminal Input is at a high level, the signal received at the signal input terminal is an output signal of a previous stage of shift register unit, such that a transistor M1' is turned on; when a first clock signal input terminal CLK1 is at a low level, a capacitor C1' is charged by the high level signal at the input terminal, such that a potential at a first node (PU node) is pulled up and transistors M5' and M6' are turned on; when the ratio of the size of transistor M5' to that of transistor M6' is designed such that the potential at a PD node is at low at this time, transistors M8' and M9' are turned off, and thus the stability of the output signal can be ensured.

During a second phase, the signal input terminal Input is at a low level, transistor M1' is turned off, the first node PU continuously remains at the high potential, and transistor M3' remains in an ON state. At this time, the first clock signal input terminal CLK1 is at a high potential, the voltage at the first node is raised up due to bootstrapping effect and a driving signal is finally outputted to the output terminal; at this time, the first node (PU node) is at a high potential, transistor M6' still in an ON state, such that transistors M8' and M9' are continuously in an OFF state, and thus the stability of the output signal can be ensured.

During a third phase, a reset signal input terminal is connected to an output terminal of a shift register at a next stage, and an output signal G(n+1) of the next stage (i.e. signal at a reset terminal Reset) is at a high level. Transistors M2' and M4' are turned on by the high level signal at the reset signal input terminal, such that the first node (PU node) and the output terminal Output are pulled down and transistor M3' is turned off, and the output signal is pulled down to the potential VGL.

During a fourth phase, a second clock signal input terminal CLK2 is at a low level, the second clock signal and the first clock signal have a same period but have opposite phases. The first clock signal input terminal CLK1 is at a high potential, transistor M5' is turned off, the potential at the second node (PD node) is at low potential, transistors M8' and M9' are turned off. At this time, the first node (PU node) and the output terminal Output are discharged through transistors M2' and M4' respectively at the previous phase, transistor M6' is in an OFF state, such that the second node (PD node) is not discharged.

During a fifth phase, the second clock signal input terminal CLK2 is at a high potential, the transistor M5' is turned on since the second clock signal input terminal CLK2 is at the high potential, and the potential at the second node (PD node) is pulled up, such that the transistors M8' and M9' are turned on, noises at the first node (PU node) and the output terminal Output are removed, such that the coupling noise voltage caused by the first clock signal input terminal CLK1 is eliminated, the low level of the output signal is ensured and the stability of the output signal can be ensured.

However, the above-described shift register unit can only remove noise at the output terminal during partial time of the operational period, but is in a floating state during other time periods, which renders large noise in the output signal at the output terminal of the shift register unit, thus causing an error output signal and potential safety problems.

SUMMARY

In embodiments of the present disclosure, there are provided a shift register unit and driving method for the shift register unit, a shift register and a display device capable of reducing noise in the output signal of the existing shift register.

According to an aspect of the present disclosure, there is provided a shift register unit comprising a first capacitor, an input buffering module, a pulling-up module, a reset control module, a pulling-down module and a pulling-down enhancement module; wherein the input buffering module is connected to a start signal input terminal, the pulling-down module, a first terminal of the first capacitor and the pulling-up module, and is configured to pre-charge the first capacitor during a signal input buffering phase; the pulling-up module is connected to a first clock signal input terminal, the first capacitor, the input buffering module, the pulling-down module and a signal output terminal, and is configured to control the signal output terminal to output a driving signal during a signal output phase; the reset control module is connected to a reset signal input terminal, a low level signal input terminal and the pulling-down module, and is configured to control the pulling-down module to be in an OFF state during a reset phase; the pulling-down module is connected to a second clock signal input terminal, the low level signal input terminal, the signal output terminal, the input buffering module, the first capacitor, the pulling-up module and the reset control module, and is configured to reduce the level at the signal output terminal and discharge the first capacitor during a first noise-removal phase; the pulling-down enhancement module is connected to the first clock signal input terminal and the pulling-down module, and is configured, in cooperation with the pulling-down module, to continuously reduce the level at the signal output terminal and continuously discharge the first capacitor during a second noise-removal phase.

In an example, the input buffering module comprises a first transistor having a gate and a first electrode connected to the signal input terminal and a second electrode connected to a first node.

In an example, the pulling-up module comprises a third transistor having a gate connected to the first node, a first electrode connected to the first clock signal input terminal and a second electrode connected to the signal output terminal.

In an example, the reset control module comprises a second transistor and a fourth transistor, wherein the second transistor has a gate connected to the reset signal input terminal, a first electrode connected to the first node and a second electrode connected to the low level signal input terminal, and the fourth transistor has a gate connected to the reset signal input terminal, a first electrode connected to the signal output terminal and a second electrode connected to the low level signal input terminal.

In an example, the pulling-down module comprises a fifth transistor, a sixth transistor, an eighth transistor and a ninth transistor, wherein the fifth transistor has a first electrode and a gate connected to a second clock signal input terminal and a second electrode connected to a second node; the sixth transistor has a first electrode connected to the second node, a gate connected to the first node and a second electrode connected to the low level signal input terminal; the eighth transistor has a first electrode connected to the first node, a gate connected to the second node and a second electrode connected to the low level signal input terminal; and the ninth transistor has a first electrode connected to the signal output terminal, a gate connected to the second node and a second electrode connected to the low level signal input terminal.

In an example, the pulling-down enhancement module comprises at least one seventh transistor, wherein the seventh transistor has a first electrode and a gate connected to the first clock signal input terminal and a second electrode connected to the second node.

In an example, the first electrodes are sources and the second electrodes are drains.

According to another aspect of the present disclosure, there is provided a shift register comprising a plurality of stages of any one of the above shift register units; except a first stage of shift register unit and a last stage of shift register unit, a start signal input terminal of each stage of shift register unit is connected to a signal output terminal of a previous stage of shift register unit thereof, and a reset signal input terminal of each stage of shift register unit is connected to a signal output terminal of a next stage of shift register unit thereof.

According to another aspect of the present disclosure, there is further provided a display device comprising the above shift register, wherein the signal output terminal of each shift register is connected to a corresponding gate line.

According to another aspect of the present disclosure, there is further provided a driving method for the shift register unit, wherein the method depends on the above shift register unit and comprises: during a signal input buffering phase, the input buffering module being in an ON state, the pulling-up module, the reset control module, the pulling-down module and the pulling-down enhancement module being in an OFF state, and the input buffering module pre-charging the first capacitor; during a signal output phase, the pulling-up module being in an ON state, the input buffering module, the reset control module, pulling-down module and the pulling-down enhancement module being in an OFF state, and the pulling-up module controlling the signal output terminal to output a driving signal; during a reset phase, the reset control module being in an ON state, the input buffering module and the pulling-up module being in an OFF state, and the reset control module controlling the pulling-down module and the pulling-down enhancement module to be in an OFF state; during a first noise-removal phase, the reset control module, the pulling-down module and the pulling-down enhancement module being in an ON state, the input buffering module and the pulling-up module being in an OFF state, and the pulling-down module reducing the level at the signal output terminal and discharging the first capacitor; during a second noise-removal phase, the reset control module, the pulling-down module and the pulling-down enhancement module being in an ON state, the input buffering module and the pulling-up module being in an OFF state, and the pulling-down enhancement module, in cooperation with the pulling-down module, continuously reducing the level at the signal output terminal and continuously discharging the first capacitor; before start of a next frame, the shift register unit undergoing the first noise-removal phase and the second noise-removal phase in alternative repeatedly so as to continuously reduce the level of the signal output terminal and to discharge the first capacitor.

In an example, the first clock signal and the second clock signal have a same period but have opposite phases.

In the shift register unit and driving method for the shift register unit, the shift register and the display device, the shift register unit not only can achieve the function for gate driving for a liquid crystal display, but also can remove noise in the output signal of the output terminal when the output terminal of the shift register unit is in an inactive state so as to reduce noise, to reduce possibility of error output and improve reliability of the shift register.

DETAILED DESCRIPTION

Figure 1:
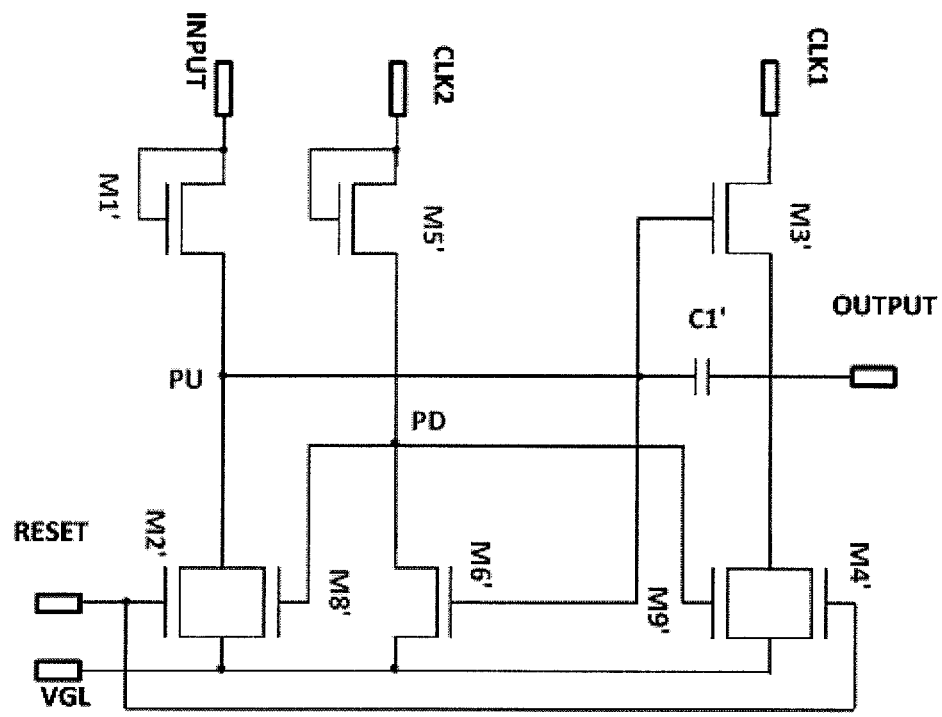
FIG. 1 is a schematic diagram of structure of a shift register unit in prior art.
Figure 2:
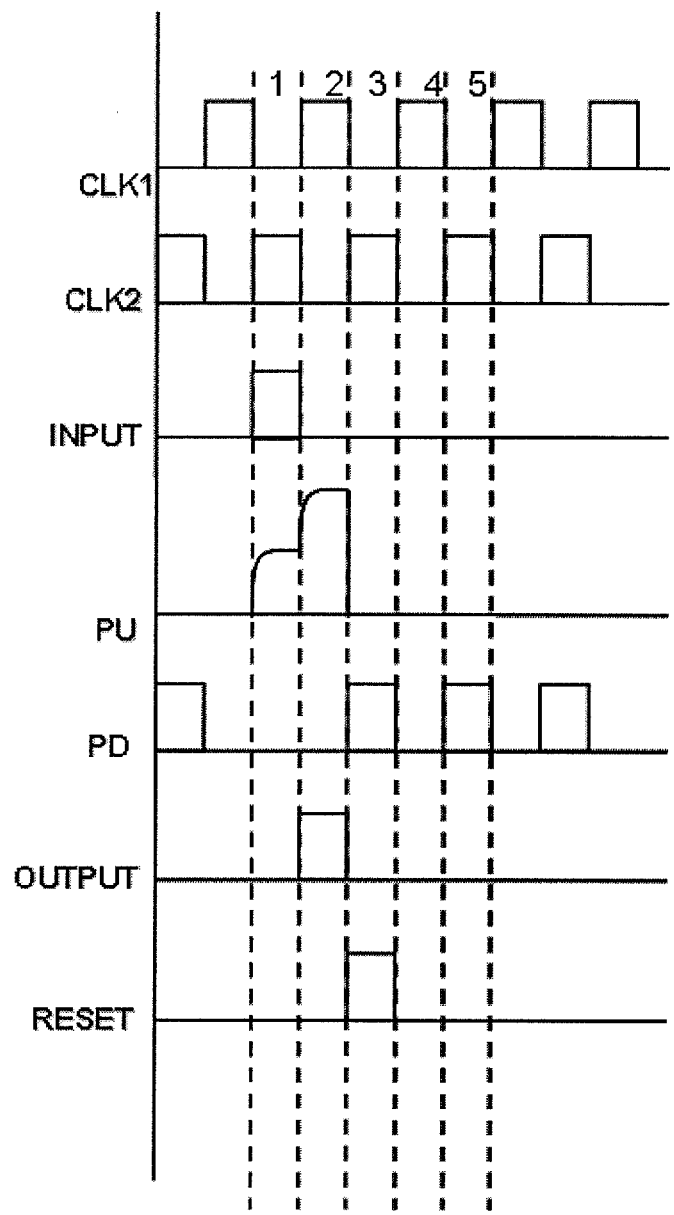
FIG. 2 is an operational timing sequence diagram of the shift register unit in prior art.

Below, specific implementations of the present disclosure will be further described in detail with reference to embodiments of the present disclosure and the accompanying drawings. The following embodiments are illustrative for the present invention, but not limitative for the scope of the present invention.

In one implementation of the present disclosure, there is provided a shift register unit comprising a first capacitor, an input buffering module 31, a pulling-up module 32, a reset control module 33, a pulling-down module 34 and a pulling-down enhancement module 35.

The input buffering module 31 is connected to a start signal input terminal INPUT, the pulling-down module 34, a first terminal of the first capacitor C1 and the pulling-up module 32, and is configured to pre-charge the first capacitor C1 during a signal input buffering phase.

The pulling-up module 32 is connected to the first clock signal input terminal CLK1, the first capacitor C1, the input buffering module 31, the pulling-down module 34 and the signal output terminal OUTPUT, and is configured to control the signal output terminal OUTPUT to output a driving signal during a signal outputting phase.

The reset control module 33 is connected to a reset signal input terminal RESET, a low level signal input terminal VGL and the pulling-down module 34, and is configured to control the pulling-down module 34 to be in an OFF state during a reset phase.

The pulling-down module 34 is connected to a second clock signal input terminal CLK2, the low level signal input terminal VGL, the signal output terminal OUTPUT, the input buffering module 31, the first capacitor C1, the pulling-up module 32 and the reset control module 33, and is configured to reduce the potential at the signal output terminal OUTPUT and discharge the first capacitor C1 during a first noise-removal phase.

The pulling-down enhancement module 35 is connected to the first clock signal input terminal CLK1 and the pulling-down module 34, and is configured, in cooperation with the pulling-down module 34, to continuously reduce the potential at the signal output terminal OUTPUT and continuously discharge the first capacitor C1 during a second noise-removal phase.

Figure 3:
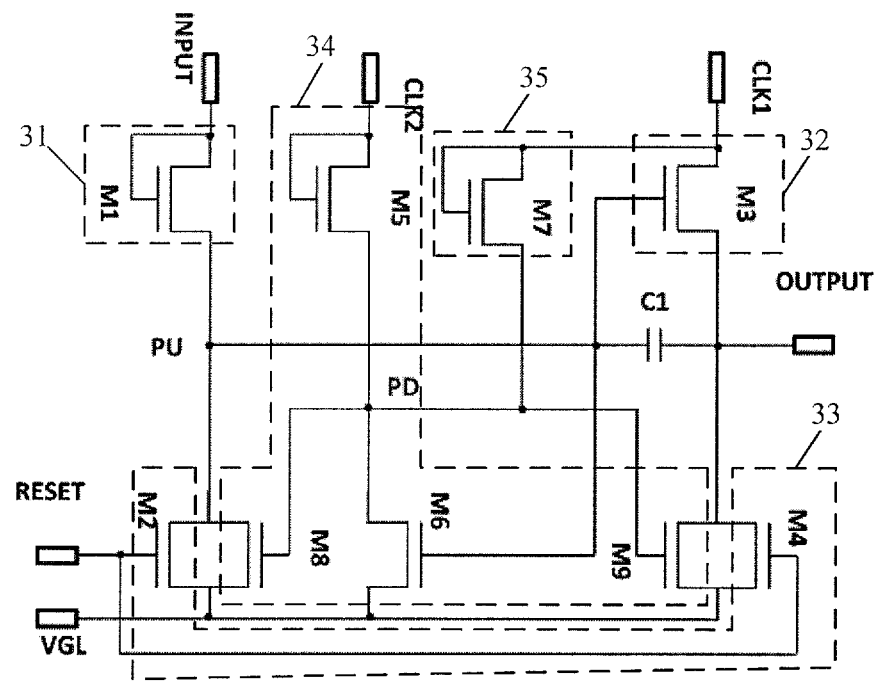
FIG. 3 is a schematic diagram of structure of a shift register unit provided in embodiments of the present disclosure.

Here, with reference to FIG. 3, the input buffering module 31 comprises a first transistor M1 having a gate and a first electrode connected to the start signal input terminal INPUT and a second electrode connected to a first node PU.

The pulling-up module 32 comprises a third transistor M3 having a gate connected to the first node PU, a first electrode connected to the first clock signal input terminal CLK1 and a second electrode connected to the signal output terminal OUTPUT.

The reset control module 33 comprises a second transistor M2 and a fourth transistor M4.

The second transistor M2 has a gate connected to the reset signal input terminal RESET, a first electrode connected to the first node PU and a second electrode connected to the low level signal input terminal VGL.

The fourth transistor M4 has a gate connected to the reset signal input terminal RESET, a first electrode connected to the signal output terminal OUTPUT and a second electrode connected to the low level signal input terminal VGL.

The pulling-down module 34 comprises a fifth transistor M5, a sixth transistor M6, an eighth transistor M8 and a ninth transistor M9.

The fifth transistor M5 has a first electrode and a gate connected to a second clock signal input terminal CLK2, and a second electrode connected to a second node PD.

The sixth transistor M6 has a first electrode connected to the second node PD, a gate connected to the first node PU, and a second electrode connected to the low level signal input terminal VGL.

The eighth transistor M8 has a first electrode connected to the first node PU, a gate connected to the second node PD, and a second electrode connected to the low level signal input terminal VGL.

The ninth transistor M9 has a first electrode connected to the signal output terminal OUTPUT, a gate connected to the second node PD, and a second electrode connected to the low level signal input terminal VGL.

The pulling-down enhancement module 35 comprises at least one seventh transistor M7 having a first electrode and a gate connected to the first clock signal input terminal CLK1, and a second electrode connected to the second node PD.

Here, the first electrodes are sources and the second electrodes are drains. Sources and drains of the transistors adopted in the embodiments of the present disclosure are interchangeable since the sources and the drains are symmetric in structure. In the embodiments of the present disclosure, in order to distinguish the two electrodes other than the gate of a transistor, one of the two electrodes is referred to as a source and the other is referred to as a drain. The drain will function as a signal output terminal if the source is selected as a signal input terminal, vice versa.

In addition, it should be clear that there is no specific distinction between the source and the drain for a transistor in the liquid crystal display field. Therefore, the first electrode of the transistor discussed in the embodiments of the present disclosure may be the second electrode of the transistor and the second electrode of the transistor discussed in the embodiments of the present disclosure may be the first electrode.

In the above implementation, the first transistor M1, the second transistor M2, the third transistor M3, the fourth transistor M4, the fifth transistor M5, the sixth transistor M6, the seventh transistor M7, the eighth transistor M8 and the ninth transistor M9 are all N-type transistors.

Figure 4:
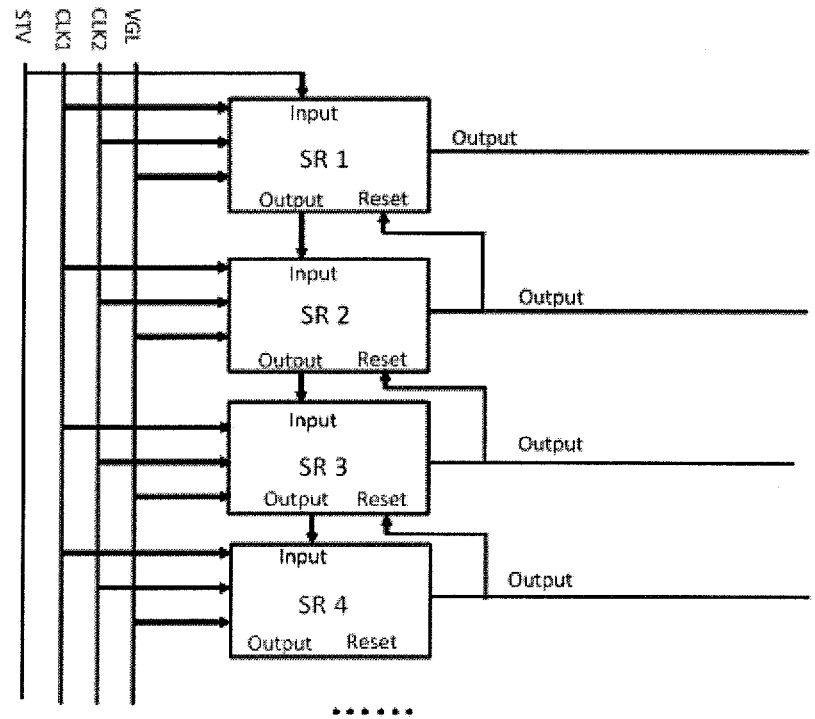
FIG. 4 is a structural diagram of a shift register unit provided in embodiments of the present disclosure.

In addition, in the implementations of the present disclosure, there is provided a shift register comprising a plurality of stages of the above-described shift register units. With reference to FIG. 4 which is a structural diagram of the shift register provided in the implementations of the present disclosure, the shift register comprises a first stage of shift register unit SR1, a second stage of shift register unit SR2, a third stage of shift register unit SR3, a fourth stage of shift register unit SR4, . . . . Except the first stage of shift register unit and a last stage of shift register unit, a start signal input terminal of each stage of shift register unit is connected to a signal output terminal of a previous stage of shift register unit thereof, and a reset signal input terminal of each stage of shift register unit is connected to a signal output terminal of a next stage of shift register unit thereof. Here, an input signal of the first stage of shift register unit is a field synchronization signal, a reset signal input terminal of the last stage of shift register unit can be connected to a reset unit which may be an additional redundant shift register unit or may be an additional inverter.

In addition, in the embodiments of the present disclosure, there is further provided a driving method for the shift register unit. Here, the method depends on the above shift register unit and comprises:

a signal input buffering phase during which the input buffering module is in an ON state, the pulling-up module, the reset control module, the pulling-down module and the pulling-down enhancement module are in an OFF state, and the input buffering module pre-charges the first capacitor;

a signal output phase during which the pulling-up module is in an ON state, the input buffering module, the reset control module, pulling-down module and the pulling-down enhancement module are in an OFF state, and the pulling-up module controls the signal output terminal to output a driving signal;

a reset stage during which the reset control module is in an ON state, the input buffering module and the pulling-up module are in an OFF state, and the reset control module controls the pulling-down module and the pulling-down enhancement module to be in an OFF state;

a first noise-removal phase during which the reset control module, the pulling-down module and the pulling-down enhancement module are in an ON state, the input buffering module and the pulling-up module are in an OFF state, and the pulling-down module reduces the level at the signal output terminal and discharges the first capacitor.

a second noise-removal phase during which the reset control module, the pulling-down module and the pulling-down enhancement module are in an ON state, the input buffering module and the pulling-up module are in an OFF state, and the pulling-down enhancement module cooperates with the pulling-down module to continuously reduce the level at the signal output terminal and to continuously discharge the first capacitor;

Before start of a next frame, the shift register unit undergoes the first noise-removal phase and the second noise-removal phase in alternative repeatedly so as to continuously reduce the level of the signal output terminal and to discharge the first capacitor.

Here, the first clock signal and the second clock signal have a same period but have opposite phases. For example, the second clock signal will be CLKB if the first clock signal is CLK, and the second clock signal will be CLK if the first clock signal is CLKB.

Figure 5:
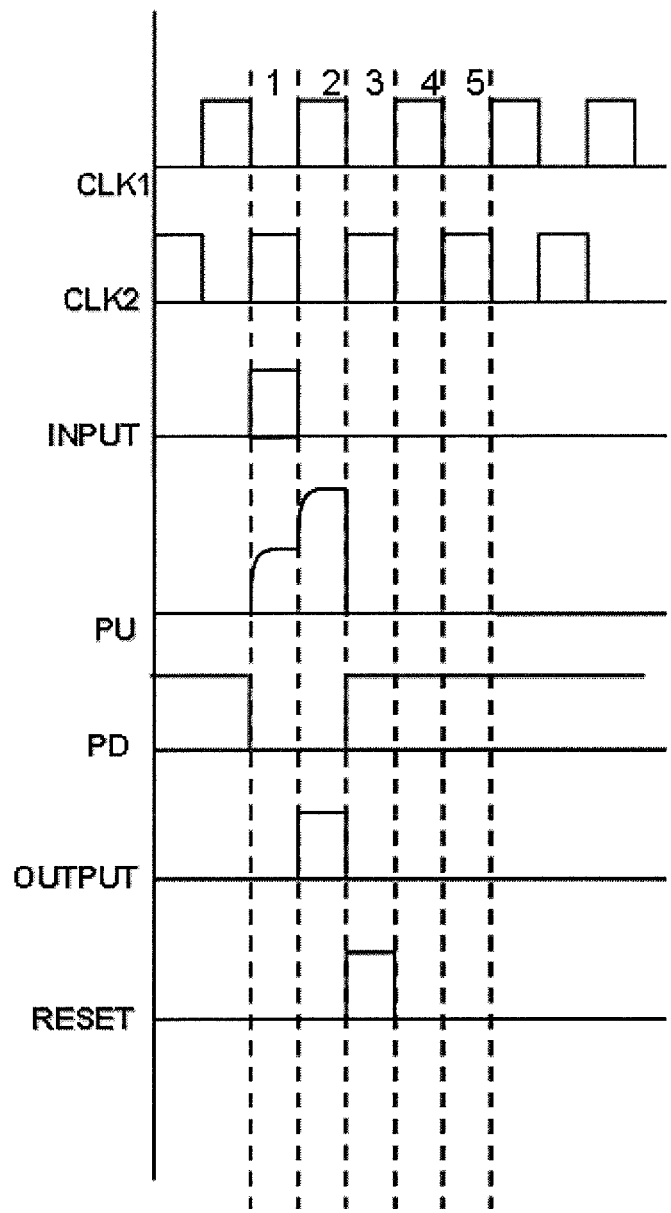
FIG. 5 is an operational timing sequence diagram of the shift register unit provided in embodiments of the present disclosure.

In order to further illustrate the shift register unit provided in the implementations of the present disclosure, the operational principle of the shift register unit will be described below with reference to the timing sequence diagram shown in FIG. 5.

During a first phase, the start signal input terminal INPUT receives a high level signal which is an output signal of a previous stage of shift register unit, such that the first transistor M1 is turned on; the high level signal at the signal input terminal charges the capacitor C1 when the first clock signal input terminal CLK1 is at a low level, such that the potential at the first node PU is pulled up and the sixth transistor M6 is turned on; the potential at the second node PD is at a low level at this time; as a result, the eighth transistor M8 and the ninth transistor M9 are turned off, and thus stability of the output signal can be ensured.

During a second phase, when the start signal input terminal INPUT is at a low level, the first transistor M1 is turned off, the first node PU remains at a high level, and the third transistor M3 remains in an ON state. At this time, the first clock signal input terminal CLK1 is at a high level, the potential at the first node PU is raised up due to a bootstrapping effect and a driving signal is ultimately transferred to the output terminal. At this time, the seventh transistor M7 is turned on since the first clock signal input terminal CLK1 is at a high level and the sixth transistor M6 remains at a low level since the first node PU is at a high level; the second node PD is at a low level by designing the ratio of the size of the seventh transistor M7 to that of the sixth transistor M6, such that the eighth transistor M8 and the ninth transistor M9 remain in an OFF state, and thus stability of the output signal can be ensured.

During a third phase, a signal at the reset signal input terminal (that is, an output signal G(n+1) of the next stage of shift register unit) is at a high level since the reset signal input terminal of the shift register unit is connected to the output terminal of the next stage of the shift register unit. The second transistor M2 and the fourth transistor M4 are turned on due to the high level signal at the reset signal input terminal, such that the first node PU and the output terminal OUTPUT are pulled down, the third transistor M3 is turned off, and the output signal is pulled down to the level of VGL. At this time, the seventh transistor M7 is turned off since the first clock signal input terminal CLK1 is at a low level, and the fifth transistor M5 is turned on since the second clock signal input terminal CLK2 is at a high level, the sixth transistor M6 is turned off since the first node PU is at a low level, and the eighth transistor M8 and the ninth transistor M9 are turned on since the second node PD is at a high level, such that noises at the first node PU and at the signal output terminal OUTPUT can be removed, and the coupling voltage noise caused by the first clock signal input terminal CLK1 can be removed, the low level of the output signal can be ensured, and thus stability of the output signal can be ensured.

During a fourth phase, the second clock signal input terminal CLK2 is at a low level. At this time, the sixth transistor M6 is in an OFF state since the first node PU and the output terminal OUTPUT have been discharged by the second transistor M2 and the fourth transistor M4 during the previous phase, the fifth transistor M5 is turned off and the seventh transistor M7 is turned on since the first clock signal input terminal CLK1 is at a high level, such that the second node PD remains at a high level, the eighth transistor M8 and the ninth transistor M9 can operate continuously to remove noises at the first node PU and at the output terminal OUTPUT.

During a fifth phase, since the second clock signal input terminal CLK2 is at a high level and the first clock signal input terminal CLK1 is at a low level, the fifth transistor M5 is turned on and the sixth transistor M6 remains in an OFF state, such that the level at the second node PD can be maintained, the eighth transistor M8 and the ninth transistor M9 are turned on to remove noises at the first node PU and at the output terminal OUTPUT, the low level of the output signal can be ensured, and thus stability of the output signal can be ensured.

Before start of a next frame, the shift register unit undergoes the fourth phase and the fifth phase repeatedly so as to continuously remove noise for the gate circuit.

The shift register unit provided in the implementations of the present disclosure not only can achieve the function of performing gate driving for the liquid crystal display, but also can remove noise in the shift register unit and thereby reduce noise in the output signal when the output terminal of the shift register unit is in an inactive state, and as a result, possibility of error output of the shift register unit is decreased. Some crucial TFTs in the shift register unit are in an OFF state substantively when the output terminal of the shift register unit is at an inactive state, and thus it can be avoided that the life span of the shift register is shortened or the signal of the shift register is outputted in error due to the drift of the threshold voltage of the TFTs.

In addition, in the embodiments of the present disclosure, there is further provided a display device including the above-described shift register, and the signal output terminal of each shift register is connected to a corresponding gate line. The display device may be any product or means with display function, such as a liquid crystal panel, electronic paper, an OLED panel, a mobile phone, a tablet computer, a television, a display, a notebook computer, a digital photo frame, a navigator, and the like.

The above implementations are only for illustrating the embodiments of the present disclosure, and in no way limit the scope of the present disclosure. It will be obvious that those skilled in the art may make modifications, variations and equivalences to the above embodiments without departing from the spirit and scope of the present disclosure.

Therefore, all equivalent technical solutions belong to the scope of the present disclosure defined by the following claims.

The present application claims priority of Chinese Patent Application No. 201310738632.3 filed on Dec. 27, 2013, which is entirely incorporated herein as a part of the present application by reference.

What is claimed is:

1. A stage of shift register unit in a shift register, the stage of shift register unit comprises a first capacitor, an input buffering module, a pulling-up module, a reset control module, a pulling-down module and a pulling-down enhancement module, wherein the input buffering module is directly connected to a start signal input terminal, the pulling-down module, a first terminal of the first capacitor and the pulling-up module, and is configured to pre-charge the first capacitor during a signal input buffering phase;

the pulling-up module is directly connected to a first clock signal input terminal, the first capacitor, the input buffering module, the pulling-down module and a signal output terminal, and is configured to control the signal output terminal to output a driving signal during a signal output phase;

the reset control module is directly connected to a reset signal input terminal, a low level signal input terminal and the pulling-down module, and is configured to control the pulling-down module to be in an OFF state during a reset phase;

the pulling-down module is directly connected to a second clock signal input terminal, the low level signal input terminal, the signal output terminal, the input buffering module, the first capacitor, the pulling-up module and the reset control module, and is configured to reduce the level at the signal output terminal and discharge the first capacitor during a first noise-removal phase; and the pulling-down enhancement module is directly connected to the first clock signal input terminal and the pulling-down module, and is configured, in cooperation with the pulling-down module, to continuously reduce the level at the signal output terminal and continuously discharge the first capacitor during a second noise-removal phase;

wherein the pulling-up module comprises a third transistor having a gate directly connected to a first node, a first electrode directly connected to the first clock signal input terminal and a second electrode directly connected to the signal output terminal;

the signal output terminal is configured to directly provide a trigger signal to the start signal input terminal of a next stage of shift register unit.

2. The shift register unit of claim 1, wherein the input buffering module comprises a first transistor having a gate and a first electrode directly connected to the start signal input terminal and a second electrode connected to a first node.

3. The shift register unit of claim 2, wherein the first electrode is a source and the second electrode is a drain.

4. The shift register unit of claim 1, wherein the reset control module comprises a second transistor and a fourth transistor;

the second transistor has a gate directly connected to the reset signal input terminal, a first electrode directly connected to a first node and a second electrode directly connected to the low level signal input terminal, the fourth transistor has a gate directly connected to the reset signal input terminal, a first electrode directly connected to the signal output terminal and a second electrode directly connected to the low level signal input terminal.

5. The shift register unit of claim 1, wherein the pulling-down module comprises a fifth transistor, a sixth transistor, an eighth transistor and a ninth transistor, the fifth transistor has a first electrode and a gate directly connected to a second clock signal input terminal and a second electrode directly connected to a second node;

the sixth transistor has a first electrode directly connected to the second node, a gate directly connected to a first node and a second electrode directly connected to the low level signal input terminal;

the eighth transistor has a first electrode directly connected to the first node, a gate directly connected to the second node and a second electrode directly connected to the low level signal input terminal; and the ninth transistor has a first electrode directly connected to the signal output terminal, a gate directly connected to the second node and a second electrode directly connected to the low level signal input terminal.

6. The shift register unit of claim 1, wherein the pulling-down enhancement module comprises at least one seventh transistor, wherein the seventh transistor has a first electrode and a gate directly connected to the first clock signal input terminal and a second electrode directly connected to a second node.

7. The shift register comprising a plurality of stages of shift register units of claim 1;

except a first stage of shift register unit and a last stage of shift register unit, a start signal input terminal of each stage of shift register unit is directly connected to a signal output terminal of a previous stage of shift register unit thereof, and a reset signal input terminal of each stage of shift register unit is directly connected to a signal output terminal of a next stage of shift register unit thereof.

8. The shift register of claim 7, wherein the input buffering module comprises a first transistor having a gate and a first electrode directly connected to the start signal input terminal and a second electrode directly connected to a first node.

9. The shift register of claim 8, wherein the first electrode is a source and the second electrode is a drain.

10. The shift register of claim 7, wherein the reset control module comprises a second transistor and a fourth transistor;

the second transistor has a gate directly connected to the reset signal input terminal, a first electrode directly connected to a first node and a second electrode directly connected to the low level signal input terminal, the fourth transistor has a gate directly connected to the reset signal input terminal, a first electrode directly connected to the signal output terminal and a second electrode directly connected to the low level signal input terminal.

11. The shift register of claim 7, wherein the pulling-down module comprises a fifth transistor, a sixth transistor, an eighth transistor and a ninth transistor, the fifth transistor has a first electrode and a gate directly connected to a second clock signal input terminal and a second electrode directly connected to a second node;

the sixth transistor has a first electrode directly connected to the second node, a gate directly connected to a first node and a second electrode directly connected to the low level signal input terminal;

the eighth transistor has a first electrode directly connected to the first node, a gate directly connected to the second node and a second electrode directly connected to the low level signal input terminal; and the ninth transistor has a first electrode directly connected to the signal output terminal, a gate directly connected to the second node and a second electrode directly connected to the low level signal input terminal.

12. The shift register of claim 7, wherein the pulling-down enhancement module comprises at least one seventh transistor, wherein the seventh transistor has a first electrode and a gate directly connected to the first clock signal input terminal and a second electrode directly connected to a second node.

13. The driving method for the shift register unit of claim 1, comprising:

during a signal input buffering phase, the input buffering module being in an ON state, the pulling-up module, the reset control module, the pulling-down module and the pulling-down enhancement module being in an OFF state, and the input buffering module pre-charging the first capacitor;

during a signal output phase, the pulling-up module being in an ON state, the input buffering module, the reset control module, the pulling-down module and the pulling-down enhancement module being in an OFF state, and the pulling-up module controlling the signal output terminal to output a driving signal;

during a reset phase, the reset control module being in an ON state, the input buffering module, the pulling-up module and the pulling-down enhancement module being in an OFF state, wherein the reset control module is configured to control the pulling-down module to be in an OFF state;

during a first noise-removal phase, the reset control module, the pulling-down module and the pulling-down enhancement module being in an ON state, the input buffering module and the pulling-up module being in an OFF state, and the pulling-down module reducing the level at the signal output terminal and discharging the first capacitor;

during a second noise-removal phase, the reset control module, the pulling-down module and the pulling-down enhancement module being in an ON state, the input buffering module and the pulling-up module being in an OFF state, and the pulling-down enhancement module, in cooperation with the pulling-down module, continuously reducing the level at the signal output terminal and continuously discharging the first capacitor;

before start of a next frame, the shift register unit undergoing the first noise-removal phase and the second noise-removal phase in alternative repeatedly so as to continuously reduce the level of the signal output terminal and to discharge the first capacitor.

14. The driving method of claim 13, wherein the first clock signal and the second clock signal have a same period but have opposite phases.

* * * * *